United States Patent
Ejiri

[19]

[11] Patent Number: 6,118,317
[45] Date of Patent: Sep. 12, 2000

[54] CLOCK SYNCHRONIZING SYSTEM AND SYNCHRONIZING METHOD

[75] Inventor: Satoru Ejiri, Tokyo, Japan

[73] Assignee: NEC Corporation, Tokyo, Japan

[21] Appl. No.: 09/038,967

[22] Filed: Mar. 12, 1998

[30] Foreign Application Priority Data

Mar. 12, 1997 [JP] Japan .................................. 9-056762

[51] Int. Cl.⁷ .................................................. H03L 7/00
[52] U.S. Cl. .................................................. 327/160; 327/141
[58] Field of Search ................................... 327/141, 142, 327/151, 156, 159, 160, 165, 407, 99, 104, 350, 352, 356, 360, 361; 375/373, 375, 376; 331/17

[56] References Cited

U.S. PATENT DOCUMENTS

| | | | |
|---|---|---|---|
| 5,440,259 | 8/1995 | Yokomura | 327/160 |
| 5,572,157 | 11/1996 | Takashi et al. | 327/156 |
| 5,574,757 | 11/1996 | Ogawa | 375/376 |
| 5,828,248 | 10/1998 | Masuda | 327/113 |
| 5,892,405 | 4/1999 | Kamikubo et al. | 331/1 A |

FOREIGN PATENT DOCUMENTS

| | | |
|---|---|---|
| 56-169423 | 12/1981 | Japan . |
| 57-185772 | 11/1982 | Japan . |
| 60-72416 | 4/1985 | Japan . |
| 61-267480 | 11/1986 | Japan . |
| 62-171297 | 7/1987 | Japan . |
| 64-16142 | 1/1989 | Japan . |
| 64-86715 | 3/1989 | Japan . |
| 2-137594 | 5/1990 | Japan . |
| 8-288936 | 11/1996 | Japan . |

*Primary Examiner*—My-Trang Nuton
*Attorney, Agent, or Firm*—Sughrue, Mion, Zinn, Macpeak & Seas, PLLC

[57] ABSTRACT

In the case of sending the sampled clock of transmission coded data together with the coded data and regenerating a clock synchronized with this sampled clock on the receiver side, the drawing-in is speeded up on the received side for the clock information items SCRn sent at unequal intervals. In the case of generating a control voltage of the VCXO in accordance with the received SCRn and the SCCn by the counter, the CPU calculates the amount of frequency fluctuation per unit time and generates a control voltage in accordance with this amount of fluctuation. Thereby, even if SCRn are received at unequal intervals, a rapid follow-up control of the PLL loop including the VCXO becomes possible.

20 Claims, 3 Drawing Sheets

CLOCK SYNCHRONIZING SYSTEM AND SYNCHRONIZING METHOD

BACKGROUND OF THE INVENTION

1. Field of the Invention

The present invention relates to a clock synchronizing system and a synchronizing method, in particular to a receiver-side clock synchronizing system and a synchronizing method. In a transmission scheme, the count information item obtained by counting the clock is intermittently multiplexed with the coded information data encoded by sampling of information item such as image or voice in accordance with a sampling clock and transmitted. And, the count information item is received by the receiver.

2. Description of the Related Art

One example of this type of conventional clock synchronizing system is shown in the block diagram of FIG. 3. FIG. 3A shows a transmitter side block, and coded data 101 sampled in accordance with the system clock 102 forms one input of the multiplex section 8. On the other hand, a counter 9 for counting the relevant system clock 102 is provided and this count output 103 forms the other input of the multiplex section 8 as system clock reference information item SCRn (employed as clock recovery signal on the receiver side).

Incidentally, "n" in SCRn represents the time-series numeral (number) of SCR to be intermittently multiplexed with coded data 101 in the multiplex section 8 and on letting n=1 be the first SCR, n will take an integer of 1 or greater.

In the multiplex section 8, coded data 101 and SCRn 103 which is the counter count information item are multiplexed, and the SCRn 103 is inserted into a predetermined place of the header part of a send frame and transmitted as multiplexed data 104.

On referring to FIG. 3B showing the receiver block side, the received multiplexed data 104 are supplied to the separating section 1 and separated into coded data 105 and SCRn 106, respectively. The SCRn 106 forms one input of a differential 2, to the other input is supplied the latch output of a FF (flip-flop) 7 for data latch and the difference between both inputs is output from the differential 2.

Because of being a digital signal, this difference value is converted into an analog signal by a D/A convertor 3 and becomes the control voltage for a VCXO (voltage control type oscillator) 5 via an LPF (low pass filter) 4 for smoothing this analog signal. This VCXO5 is arranged to oscillate at the same frequency as the system clock 102 and this oscillation output is used as a sampled clock 109 on the receiver side.

This oscillation output 109 is inputted to a counter 6 and successively counted. As the initial value of this counter 6, the initial value 108 from the differential 2 is loaded. This count output SCCn is transferred to the FF7 as a system clock counter value (SCC) and latched for each timing of the SCR latch pulse 107 from the separating section 1 and the latch output becomes the other input of the differential 2.

The first-time received SCR1 is loaded to the counter 6 as an initial value. The SCRn arriving at the second time and the subsequent times respectively are compared with the count value SCC2 of the counter 6 in the differential 2 and corresponding to the differential 2, the VCXO 5 is controlled, so that the received SCR2 and the SCC2 are so controlled as to coincide with each other. According to such a control, the clock of the oscillation output of the VCXO5 whose phase coincides with that of the sampled clock on the sender side ends is being obtained on the receiver side, so that the clock recovery on the receiver side is possible.

Incidentally, such a clock recovery (synchronization) scheme is shown as the ANNEX (appendix) of the standard document ISO/IEC 13818-1.

According to such a conventional prior art, in the clock recovery (synchronization) scheme on the receiver side, the differential of the clock recovery information item SCRn with a count value of a counter for counting the autorunning clock of the voltage controllable VCXO is taken and in accordance with the difference, this VCXO is controlled, thereby enabling update of a control voltage to be performed regularly.

However, by factors such as restrictions due to a format of the transmission scheme and a rise in the transmission efficiency of coded data of an image, the delivery interval of SCRn, the clock recovery information item, may become variable in some cases. If a local frequency fluctuation takes place on the time axis like this, a conventional scheme cannot follow such a frequency fluctuation and consequently has a disadvantage that the clock recovery processing (synchronous processing) delays.

SUMMARY OF THE INVENTION

It is one object of the present invention to provide a clock synchronizing system capable of minimizing the changing time of a regenerative clock in the recovery processing from an asynchronous condition that the clock on the sender side is not synchronous with the frequency (drawing-in condition) to a stable condition that it is synchronous (drawing-in time) even if the sending interval of clock recovery information items SCRn becomes variable.

According to a first aspect of the present invention, there is obtained a receiver-side clock synchronizing system in a transmission scheme that the count information item obtained by counting the clock is intermittently multiplexed with coded information data encoded by the sampling of an information item to be transmitted in accordance with a sampling clock and transmitted, comprising separator means for separating the count information item from the multiplexed receive information item; voltage control oscillator means operating at the same frequency as the frequency of the clock; counting means for counting the oscillation clock of the voltage control oscillator means; and control means for calculating the frequency fluctuation amount of the clock per unit time in accordance with the counted value of the counting means at the separating time of the count information item and the count information item separated by the separator means to generate a control voltage of the voltage control oscillator means depending on this calculated result.

And, the control means is featured by being so arranged as to load a first count information item to the counting means corresponding to the separating timing of said first count information item obtained by the separator means, while the control means is featured by comprising calculation means for calculating the frequency fluctuation amount, means for converting the calculated result into an analog amount and means for outputting this analog amount to the voltage control oscillator means as said control voltage.

The operation of the first aspect of the present invention will be described. Since the frequency deviation per unit time is calculated from a difference value between the clock recovery information item SCRn and the output counted value of the VCXO and is used to control the VCXO, the clock recovery processing becomes independent of the sending interval of SCRn, thus preventing the synchronization drawing-in time from being prolonged due to unequal sending intervals of SCRn as is conventional.

According to the second aspect of the present invention, there is obtained a receiver-side clock synchronizing method in a transmission scheme the count information item obtained by counting the clock is intermittently multiplexed with coded information data encoded by the sampling of an information item to be transmitted in accordance with a sampling clock and transmitted, comprising a first process for separating the count information item from the multiplexed receive information item; a second process for counting the oscillation clock of the voltage control oscillator circuit operating at the same one as the frequency of the clock; and a third process for calculating the frequency fluctuation amount of the clock per unit time in accordance with the counted value in the second process at the separating time of the count information item in the first process and the count information item separated in the first process to generate a control voltage of the voltage control oscillator circuit depending on this calculated result.

And, the third process is featured by having a fourth process for corresponding to the separating timing of the first count information item taking this first count information item to a counted value of the oscillation clock in the second process, and is further featured by having a fifth process for calculating the frequency fluctuation amount, a sixth process for converting this calculated result into an analog amount and a seventh process for outputting this analog amount to the voltage control oscillator circuit as the control voltage.

The operation of the second aspect of the present invention is similar to that of the first aspect and thus its description will be omitted.

DESCRIPTION OF THE PREFERRED EMBODIMENT

Figure 1A:
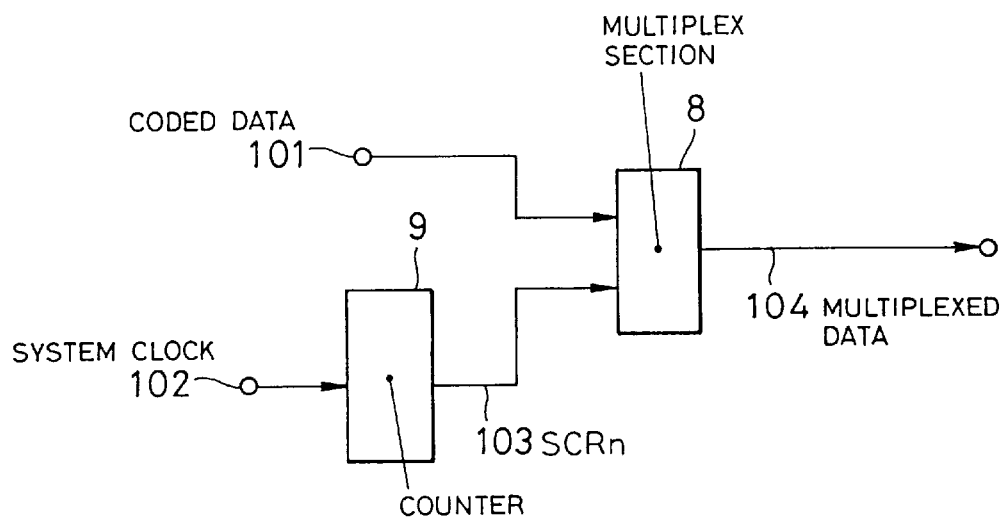
FIGS. 1A and 1B are block diagrams of one embodiment of the present invention.

Hereinafter, referring to the drawings, one embodiment of the present invention will be described.

Figure 3A:
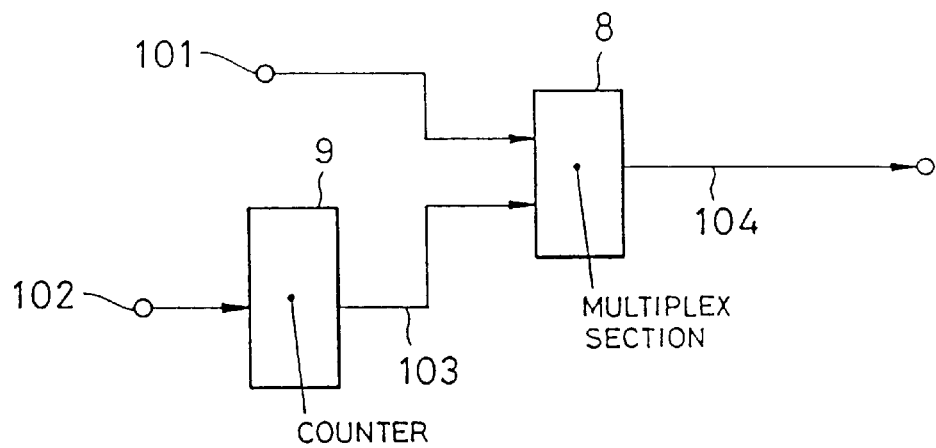
FIGS. 3A and 3B are illustrations of a conventional clock synchronous scheme.

FIG. 1 is a block diagram of one embodiment of the present invention and parts equivalent to those of FIG. 3 are denoted by like symbols. FIG. 1A is a sender-side block diagram and is equivalent to FIG. 3A, the description of which is omitted.

Figure 1B:
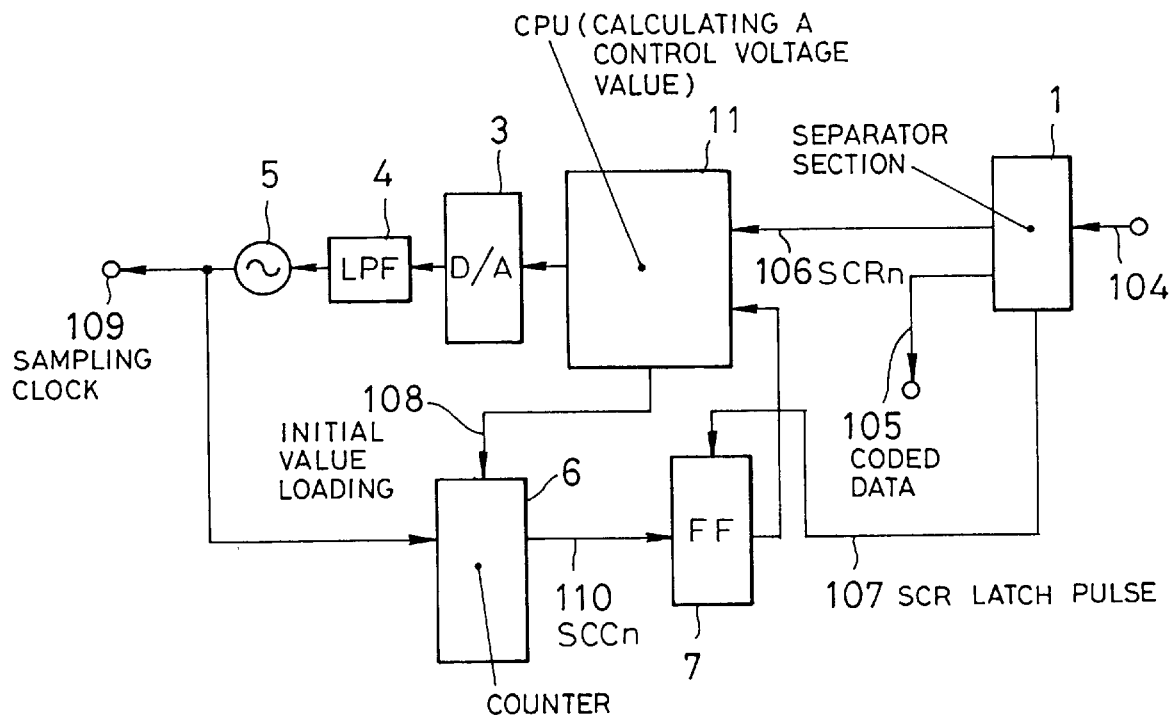
Figures 2A, 2B:
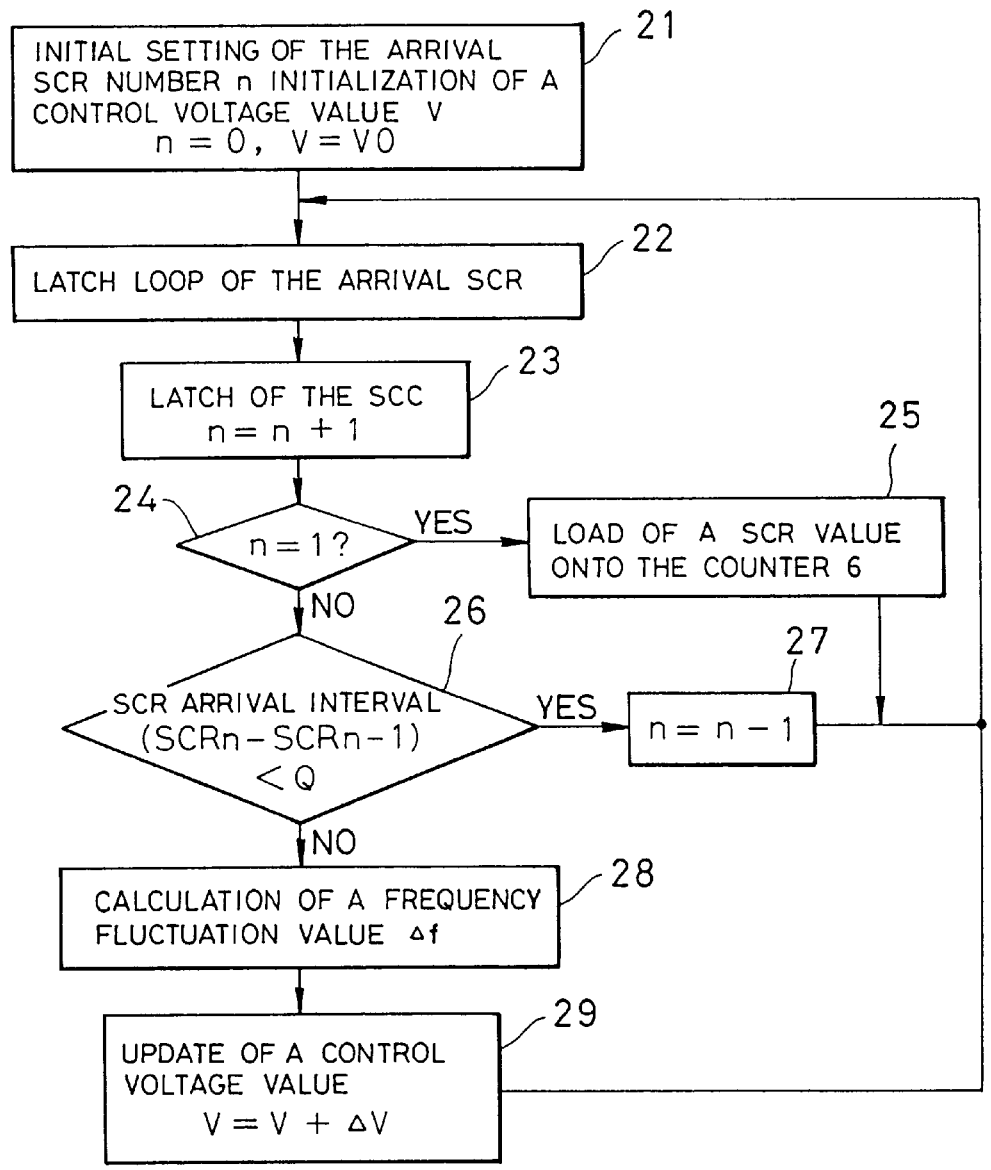
FIG. 2A is a flow chart showing the operation of one embodiment of the present invention and FIG. 2B is a equation for calculating a frequency fluctuation value.
Figure 3B:
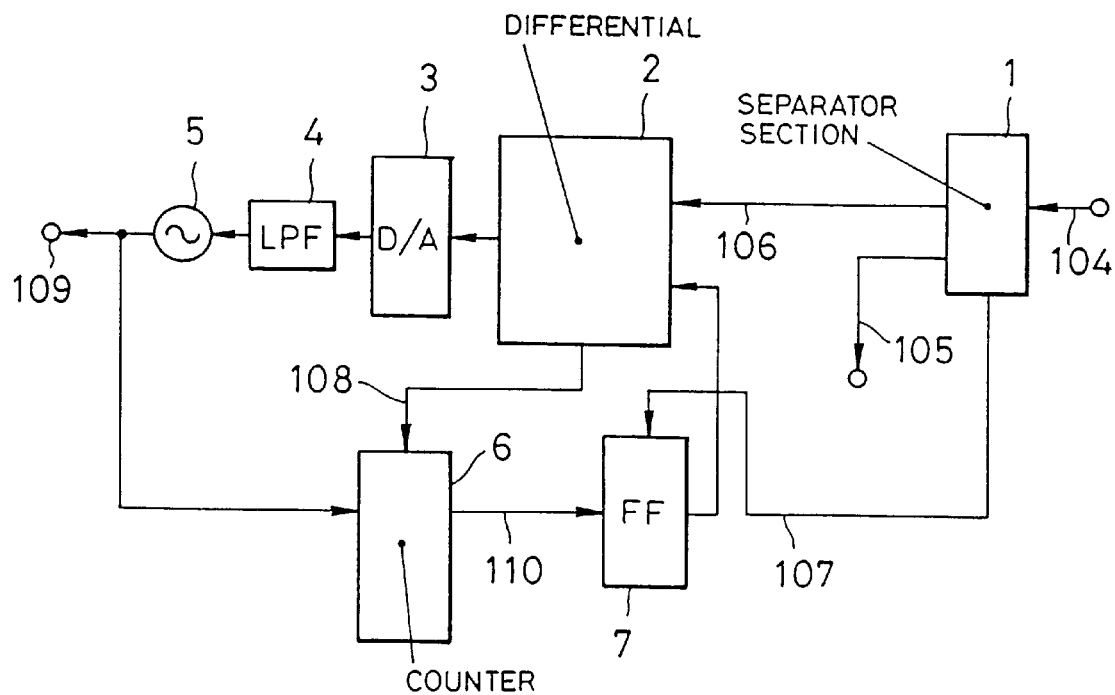

FIG. 1B is a receiver-side block diagram and different parts from those of FIG. 3B will be described. In place of the differential 2 of FIG. 3B, this embodiment uses the CPU 11 (processor for the calculation of a control voltage) shown in FIG. 2 for the control of operations, inputs of which are an SCRn and a latch output SCCn by the FF7 as conventional system.

Referring to the flow chart of FIG. 2A, operation will be described. First, initial setting of the number n of the received SCR and initialization (n=0 and V=V$_0$) of the initial value of control voltage value V of the VCXO5 is performed (21) and the arrival of the SCR is being waited for (22).

The SCR0 that has arrived at the first time is loaded as the initial value on the counter 6 (23–25). Thus, from the SCRn that has arrived at the second time and the subsequent times, a frequency fluctuation value is calculated by the CPU11. That is, the SCCn of the counter 6 is latched to the FF7 at the separating timing of the SCRn (23, 24) and calculation is performed (26, 28). In accordance with the detail shown in FIG. 2B, the equation $$[\{(SCCn-SCRn)-(SCCn-1-SCRn-1)\}/(SCRn-SCRn-1)] \times 10^6 \quad (1)$$

is calculated. The denominator of this equation (1) represents the receiving internal of SCR, thus the equation (1) representing the frequency fluctuation amount $\Delta f$ of SCC to SCR per unit hour.

Corresponding to this frequency variation $\Delta f$, a control voltage Vn of the VCXO5 is generated, so that frequency phase control of the VCXO5 is performed (29). In this case, assuming that the characteristics of the VCXO5 employed is S (ppm/voltage), this control voltage Vn becomes an addition of $\Delta V = \Delta f/S$ to the current value.

Incidentally, if the difference in the arrival time of the SCR is smaller than a predetermined value Q, errors in SCC of the receiver-side counter 6 and the received SCR affect the frequency fluctuation and accordingly in this case, calculation is performed using the next-time received SCR without this-time calculation (26, 27).

As described above, according to the present invention, a scheme that the frequency fluctuation amount calculated per unit time is used for the control is employed and in a case where SCR arrives at unequal intervals, there is an advantageous effect that the frequency drawing-in time of a clock can be made faster than a conventional control scheme using the integration of the difference information item between the SCR and the SCC.

Besides, since the frequency fluctuation amount is always calculated, there is another advantageous effect of being able to monitor in real-time whether or not it satisfies the frequency range prescribed in the international standard or the like or whether or not the frequency is abnormal.

What is claimed is:

1. A receiver-side clock synchronizing system in a transmission scheme that a count information item obtained by counting the clock is intermittently multiplexed with coded information data encoded by a sampling of an information item to be transmitted in accordance with a sampling clock and transmitted, comprising:

separator means for separating said count information item from a multiplexed receive information item;

voltage control oscillator means operating at the same frequency as a frequency of said clock;

counting means for counting an oscillation clock of the voltage control oscillator means; and control means for calculating a frequency fluctuation amount of said clock per unit time in accordance with a counted value of said counting means at a separating time of said count information item and said count information item separated by said separator means to generate a control voltage of said voltage control oscillator means depending on this calculated result.

2. A receiver-side clock synchronizing system as set forth in claim 1, wherein said control means is so arranged as to load a first count information item to said counting means corresponding to the separating timing of said first count information item obtained by the separator means.

3. A receiver-side clock synchronizing system as set forth in claim 1, wherein said control means comprises calculation means for calculating said frequency fluctuation amount, means for converting this calculated result into an analog amount and means for outputting this analog amount to said voltage control oscillator means as said control voltage.

4. A receiver-side clock synchronizing system as set forth in claim 1, wherein said information item to be transmitted comprises image and voice information.

5. A receiver-side clock synchronizing system as set forth in claim 1, wherein
said control means divides a subtraction of the difference between a prior counted value of said counting means and a prior count information item from the difference between a current counted value of said counting means and a current count information item by the difference between said current count information item and the prior count information item to calculate said frequency fluctuation amount.

6. A receiver-side clock synchronizing system as set forth in claim 1, wherein
said control means does not make a calculation of said frequency fluctuation amount when the difference between a current count information item and a prior count information item is smaller than a predetermined value.

7. A receiver-side clock synchronizing system as set forth in claim 1, wherein
said counting means comprises a counter for counting the clock count of said oscillation clock and a latch circuit for latching a counted value of said counter in response to the separating timing in said separator means.

8. A receiver-side clock synchronizing method in a transmission scheme that a count information item obtained by counting the clock is intermittently multiplexed with coded information data encoded by the sampling of an information item to be transmitted in accordance with a sampling clock and transmitted, comprising a first process for separating said count information item from the multiplexed receive information item; a second process for counting an oscillation clock of a voltage control oscillator circuit operating at the same frequency of said clock; and a third process for calculating a frequency fluctuation amount of said clock per unit time in accordance with a counted value in said second process at the separating time of said count information time in the first process and said count information item separated in the first process to generate a control voltage of said voltage control oscillator circuit depending on this calculated result.

9. A receiver-side clock synchronizing method as set forth in claim 8, wherein
said third process has a fourth process for corresponding to the separating timing of a first count information item by said first process taking this first count information item to a counted value of the oscillation clock in the second process.

10. A receiver-side clock synchronizing method as set forth in claim 8, wherein
said third process comprises a fifth process for calculating said frequency fluctuation amount, a sixth process for converting this calculated result into an analog amount and a seventh process for outputting this analog amount to said voltage control oscillator circuit as said control voltage.

11. A receiver-side clock synchronizing method as set forth in claim 8, wherein
said information item to be transmitted comprises image and voice information.

12. A receiver-side clock synchronizing method as set forth in claim 8, wherein said third process divides a subtraction of the difference between a prior counted value of said second process and a prior count information item from the difference between a current counted value of said second process and a current count information item by the difference between said current count information item and the prior count information item to calculate said frequency fluctuation amount.

13. A receiver-side clock synchronizing method as set forth in claim 8, wherein
said third process further comprises an eighth process for making no calculation of said frequency fluctuation amount when the difference between said current count information item and the prior count information item is smaller than a predetermined value.

14. A receiver-side clock synchronizing method as set forth in claim 8, wherein
said second process comprises a ninth process for counting a clock number of said oscillation clock and a tenth process for latching the counted value in said ninth process in response to the separating timing in said first process.

15. A receiver-side clock synchronizing system in a transmission scheme that a count information item obtained by counting the clock is intermittently multiplexed with coded information data encoded by a sampling of an information item to be transmitted in accordance with a sampling clock and transmitted, comprising:
separator section for separating said count information item from a multiplexed receive information item;
voltage control oscillator operating at the same frequency as a frequency of said clock;
counting circuit for counting an oscillation clock of the voltage control oscillator; and
controller for calculating a frequency fluctuation amount of said clock per unit time in accordance with a counted value of said counting circuit at a separating time of said count information item and said count information item separated by said separator section to generate a control voltage of said voltage control oscillator depending on this calculated result.

16. A receiver-side clock synchronizing system as set forth in claim 15, wherein
said controller is so arranged as to load a first count information item to said counting circuit corresponding to the separating timing of said first count information item obtained by the separator section.

17. A receiver-side clock synchronizing system as set forth in claim 15, wherein
said controller comprises calculation section for calculating said frequency fluctuation amount, converter for converting this calculated result into an analog amount and outputting section for outputting this analog amount to said voltage control oscillator as said control voltage.

18. A receiver-side clock synchronizing system as set forth in claim 15, wherein
said controller divides a subtraction of the difference between a prior counted value of said counting circuit and a prior count information item from the difference between a current counted value of said counting circuit and a current count information item by the difference between said current count information item and the prior count information item to calculate said frequency fluctuation amount.

19. A receiver-side clock synchronizing system as set forth in claim 15, wherein said controller does not make a calculation of said frequency fluctuation amount when the difference between a current count information item and the prior count information item is smaller than a predetermined value.

20. A receiver-side clock synchronizing system as set forth in claim 15, wherein said counting circuit comprises a counter for counting the clock count of said oscillation clock and a latch circuit for latching a counted value of said counter in response to the separating timing in said separator section.

* * * * *